US012577407B2

(12) United States Patent
Takano et al.

(10) Patent No.: US 12,577,407 B2
(45) Date of Patent: Mar. 17, 2026

(54) HARD COAT LAMINATE

(71) Applicant: FUJIFILM Corporation, Tokyo (JP)

(72) Inventors: Nobuhiko Takano, Minamiashigara (JP); Yoshihiko Mochizuki, Minamiashigara (JP)

(73) Assignee: FUJIFILM Corporation, Tokyo (JP)

( * ) Notice: Subject to any disclaimer, the term of this patent is extended or adjusted under 35 U.S.C. 154(b) by 555 days.

(21) Appl. No.: 17/895,606

(22) Filed: Aug. 25, 2022

(65) Prior Publication Data

US 2022/0403181 A1     Dec. 22, 2022

Related U.S. Application Data

(63) Continuation of application No. PCT/JP2021/006857, filed on Feb. 24, 2021.

(30) Foreign Application Priority Data

Feb. 26, 2020     (JP) ................................. 2020-030759

(51) Int. Cl.

| | |
|---|---|
| *C09D 7/61* | (2018.01) |
| *B05D 1/00* | (2006.01) |
| *C08G 77/18* | (2006.01) |
| *C08K 3/36* | (2006.01) |
| *C09D 5/00* | (2006.01) |
| *C09D 183/06* | (2006.01) |
| *C23C 16/40* | (2006.01) |
| *C23C 16/50* | (2006.01) |

(52) U.S. Cl.
CPC .............. *C09D 5/002* (2013.01); *B05D 1/60* (2013.01); *B05D 1/62* (2013.01); *C08G 77/18* (2013.01); *C08K 3/36* (2013.01); *C09D 7/61* (2018.01); *C09D 183/06* (2013.01); *C23C 16/402* (2013.01); *C23C 16/50* (2013.01); *C08K 2201/011* (2013.01)

(58) Field of Classification Search
None
See application file for complete search history.

(56) References Cited

U.S. PATENT DOCUMENTS

| | | | |
|---|---|---|---|
| 2012/0263933 A1* | 10/2012 | Higuchi | ................. C08J 7/0423 |
| | | | 977/773 |
| 2017/0107345 A1 | 4/2017 | Kon et al. | |
| 2019/0015868 A1 | 1/2019 | Masuda et al. | |

FOREIGN PATENT DOCUMENTS

| | | |
|---|---|---|
| JP | 3-217434 A | 9/1991 |
| JP | 2004-27110 A | 1/2004 |
| JP | 2004-237513 A | 8/2004 |
| JP | 2012-224077 A | 11/2012 |
| WO | WO 2015/147295 A1 | 10/2015 |
| WO | WO 2017/115819 A1 | 7/2017 |
| WO | WO 2020/071379 A1 | 4/2020 |

OTHER PUBLICATIONS

International Preliminary Report on Patentability and Written Opinion of the International Searching Authority (Forms PCT/IB/326, PCT/IB/373, and PCT/ISA/237) for International Application No. PCT/JP2021/006857, dated Sep. 9, 2022, with an English translation.
International Search Report (Form PCT/ISA/210) for International Application No. PCT/JP2021/006857, dated Apr. 20, 2021, with an English translation.
Japanese Office Action for corresponding Japanese Application No. 2022-503649, dated Apr. 25, 2023, with English translation.
European Communication pursuant to Article 94(3) EPC for corresponding European Application No. 21760833.0, dated Apr. 5, 2024.

* cited by examiner

*Primary Examiner* — Sheeba Ahmed
(74) *Attorney, Agent, or Firm* — Birch, Stewart, Kolasch & Birch, LLP

(57)     ABSTRACT
Provided is a hard coat laminate having excellent abrasion resistance and heat resistance. The hard coat laminate includes: a substrate; and a base layer disposed on one main surface side of the substrate, in which the base layer contains inorganic nanoparticles, the base layer contains oxygen atoms, carbon atoms, and silicon atoms, the base layer has, on a surface side opposite to the substrate, a first region in which a compositional ratio of carbon atoms to all elements excluding hydrogen decreases as a distance from the substrate increases, in a region other than the first region of the base layer, a compositional ratio of carbon atoms to all elements excluding hydrogen is 5 atom % to 40 atom %, and a compositional ratio of carbon atoms on a surface of the first region is 1 atom % or less.

21 Claims, 4 Drawing Sheets

HARD COAT LAMINATE

CROSS-REFERENCE TO RELATED APPLICATIONS

This application is a Continuation of PCT International Application No. PCT/JP2021/006857 filed on Feb. 24, 2021, which claims priority under 35 U.S.C. § 119(a) to Japanese Patent Application No. 2020-030759 filed on Feb. 26, 2020. The above application is hereby expressly incorporated by reference, in its entirety, into the present application.

BACKGROUND OF THE INVENTION

1. Field of the Invention

The present invention relates to a hard coat laminate.

2. Description of the Related Art

In recent years, it has been studied to apply a lightweight polycarbonate plate-shaped member having excellent impact resistance to window glass, particularly automobile window glass. In the automobile window glass, for example, in a case of a front window, it is necessary to prevent occurrence of scratches in a case where a wiper is operated, and in a case of a side window, it is necessary to prevent occurrence of scratches in a case where the window is raised or lowered. Therefore, a high level of abrasion resistance is required. Therefore, it is considered to improve abrasion resistance by laminating a hard coat layer on a surface of a polycarbonate plate-shaped member.

A touch panel in which data and instructions can be input by touching a display screen with a finger or a pen while viewing the display on the screen has become widespread. Therefore, a display surface of an image display apparatus is required to have abrasion resistance such that visibility does not deteriorate because of damage during handling. Therefore, the hard coat layer is used to improve the abrasion resistance of the display surface of the image display apparatus.

It has been proposed to use a sol-gel film containing inorganic nanoparticles as the hard coat layer. A siloxane bond is formed of the sol-gel film, whereby it is possible to improve the abrasion resistance as compared with an organic hard coat layer containing carbon as a main component. In addition, since the sol-gel film can contain inorganic nanoparticles, it is possible to increase a hardness of the hard coat layer by containing the inorganic nanoparticles.

For example, JP2004-027110A discloses a hard coat layer formed by applying and curing a coating liquid for hard coat containing a component composed of colloidal silica and a hydrolysis condensate of trialkoxysilane as a hard coat layer.

SUMMARY OF THE INVENTION

The hard coat layer formed of the sol-gel film containing inorganic nanoparticles becomes hard by increasing a condensation rate, and the abrasion resistance is improved. However, in a case where the condensation rate is increased, internal distortion increases, so that a problem arises that stress is concentrated and peeling is generated between the hard coat layer and a substrate in a case where a thermal cycle is repeated. That is, in the hard coat layer formed of the sol-gel film containing inorganic nanoparticles, there is a trade-off relationship between abrasion resistance and heat resistance.

An object of the present invention is to solve such a problem, and to provide a hard coat laminate having excellent abrasion resistance and heat resistance.

The object of the present invention is achieved by following configurations.

[1] A hard coat laminate comprising: a substrate; and a base layer disposed on one main surface side of the substrate, in which the base layer contains inorganic nanoparticles, the base layer contains oxygen atoms, carbon atoms, and silicon atoms, the base layer has, on a surface side opposite to the substrate, a first region in which a compositional ratio of carbon atoms to all elements excluding hydrogen decreases as a distance from the substrate increases, in a region other than the first region of the base layer, a compositional ratio of carbon atoms to all elements excluding hydrogen is 5 atom % to 40 atom %, and a compositional ratio of carbon atoms on a surface of the first region is 1 atom % or less.

[2] The hard coat laminate according to [1], in which, in the first region, a compositional ratio of hydrogen atoms to all elements decreases as the distance from the substrate increases, and a compositional ratio of hydrogen atoms on the surface is 18 atom % or less.

[3] The hard coat laminate according to [1] or [2], in which the inorganic nanoparticle is at least one of oxide particles of any of Si, Ti, Zr, or Al.

[4] The hard coat laminate according to any one of [1] to [3], further comprising: an overcoat layer which contains an inorganic oxide as a main component and is disposed on a surface of the base layer on a first region side.

[5] The hard coat laminate according to [4], in which a thickness of the overcoat layer is 10 nm to 250 nm.

[6] The hard coat laminate according to [4] or [5], in which the inorganic oxide contained in the overcoat layer is at least one oxide of Si, Ti, Zr, or Al.

[7] The hard coat laminate according to any one of [1] to [6], in which the base layer is formed of a coating composition obtained by adding inorganic nanoparticles to a coating liquid containing silicon atoms, oxygen atoms, and carbon atoms.

According to the present invention, it is possible to provide a hard coat laminate having excellent abrasion resistance and heat resistance.

DESCRIPTION OF THE PREFERRED EMBODIMENTS

Figure 1:
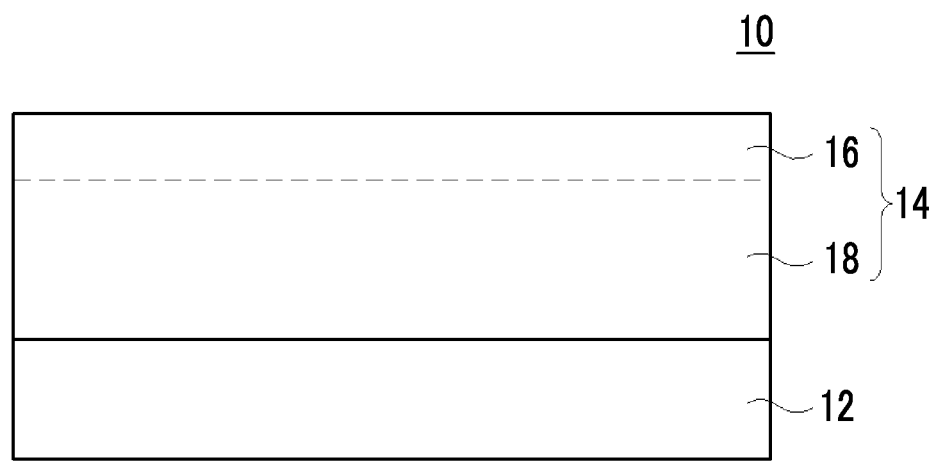
FIG. 1 is a diagram conceptually showing an example of a hard coat laminate according to the embodiment of the present invention.

Hereinafter, an embodiment of a hard coat laminate according to the present invention will be described with reference to the drawings.

The description of the configuration requirements described below may be made on the basis of typical embodiments of the present invention, but the invention is not limited to such embodiments. In the drawings of the present specification, the scale of each part is appropriately changed and shown in order to facilitate visual recognition.

In the present specification, the numerical range represented by "to" means a range including numerical values denoted before and after "to" as a lower limit value and an upper limit value.

In the following description, the term "thickness" means a length in a direction (hereinafter, thickness direction) in which a substrate and a base layer described below are arranged.

[Hard Coat Laminate]

The hard coat laminate according to the embodiment of the present invention includes a substrate, and a base layer disposed on one main surface side of the substrate, in which the base layer contains inorganic nanoparticles, the base layer contains oxygen atoms, carbon atoms, and silicon atoms derived from inorganic nanoparticles, the base layer has, on a surface side opposite to the substrate, a first region in which a compositional ratio of carbon atoms to all elements excluding hydrogen decreases as a distance from the substrate increases, in a region other than the first region of the base layer, a compositional ratio of carbon atoms to all elements excluding hydrogen is 5 atom % to 40 atom %, and a compositional ratio of carbon atoms on a surface of the first region is 1 atom % or less.

FIG. 1 is a diagram conceptually showing an example of the hard coat laminate according to the embodiment of the present invention.

FIG. 1 is a conceptual diagram, that is, a side view, of the hard coat laminate according to the embodiment of the present invention as viewed from a surface direction of a main surface. The main surface is a maximum area surface of a sheet-shaped material (film or plate-shaped material).

A hard coat laminate 10 shown in FIG. 1 includes a substrate 12 and a base layer 14 in this order.

In the following description, the substrate 12 side of the hard coat laminate 10 is also referred to as "lower", and the base layer 14 is also referred to as "upper".

As shown in FIG. 1, the base layer 14 is disposed in contact with one main surface of the substrate 12.

The base layer 14 is a layer containing inorganic nanoparticles. As will be described in detail below, the base layer 14 is a coating film formed by applying and curing a coating liquid containing inorganic nanoparticles by a sol-gel method. Since the base layer 14 contains inorganic nanoparticles, it functions as a hard coat layer that improves the abrasion resistance of a surface.

Figure 2:
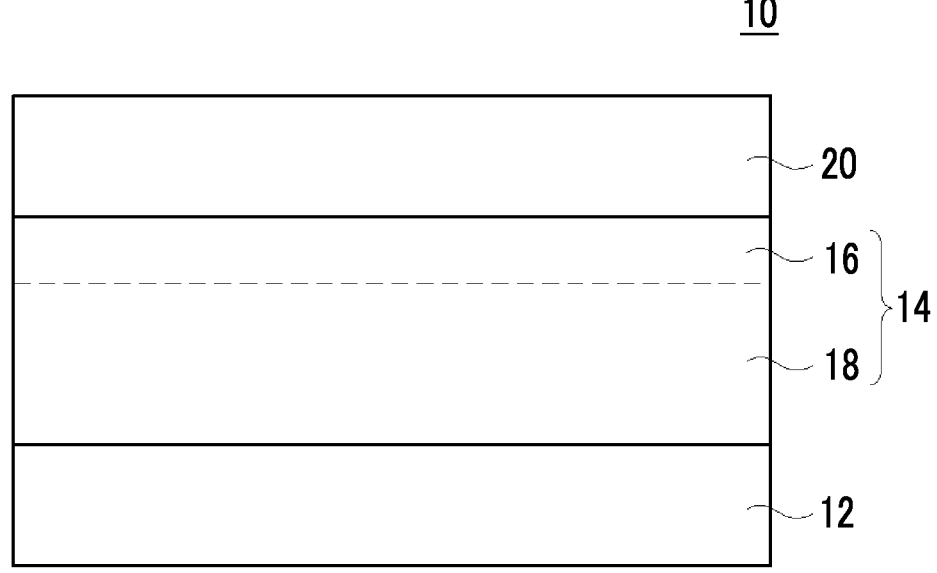
FIG. 2 is a diagram conceptually showing another example of the hard coat laminate according to the embodiment of the present invention.

In the example shown in FIG. 1, the hard coat laminate 10 has a configuration including the substrate 12 and the base layer 14, but the configuration is not limited thereto. As shown in FIG. 2, the hard coat laminate 10 includes may include the substrate 12, the base layer 14, and an overcoat layer 20 which contains an inorganic oxide as a main component and is formed on a surface of the base layer 14 opposite to the substrate 12.

Here, in the hard coat laminate 10 according to the embodiment of the present invention, the base layer 14 contains oxygen atoms, carbon atoms, and silicon atoms derived from inorganic nanoparticles, and has, on the surface opposite to the substrate 12 (hereinafter, also referred to as a surface or an interface), a first region 16 in which a compositional ratio of carbon atoms to all elements excluding hydrogen (hereinafter, also simply referred to as a compositional ratio of carbon atoms) decreases as a distance from the substrate 12 increases. In the example shown in FIG. 2, it can be said that the overcoat layer 20 is provided on the surface of the base layer 14 on the first region 16 side.

In a region (hereinafter, also referred to as a second region) 18 other than the first region 16 of the base layer 14, a compositional ratio of carbon atoms to all elements excluding hydrogen is 5 atom % to 40 atom %.

A compositional ratio of carbon atoms on the surface of the first region 16, that is, the surface of the base layer 14 opposite to the substrate 12 is 1 atom % or less.

Figure 3:
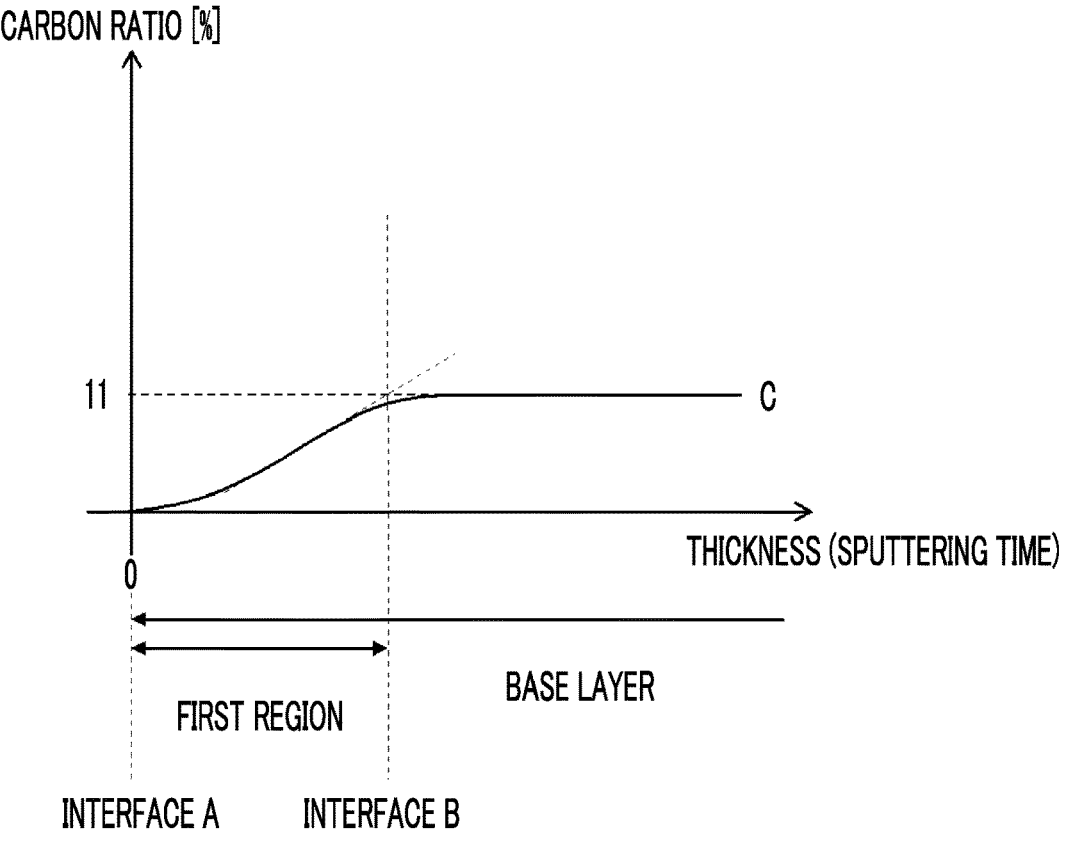
FIG. 3 is a graph schematically showing a relationship between a position in a thickness direction and a compositional ratio of carbon.
Figure 4:
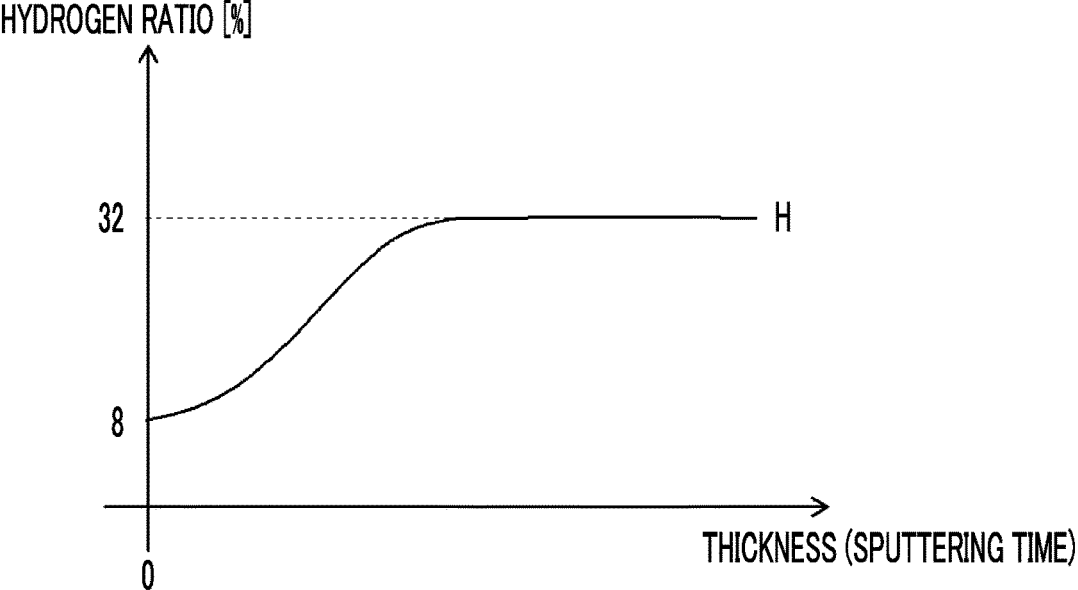
FIG. 4 is a graph schematically showing a relationship between a position in a thickness direction and a compositional ratio of hydrogen.

That is, as shown in the graph in FIG. 3, in the base layer 14, the compositional ratio of carbon atoms in the region on the substrate 12 side is substantially constant at 5 atom % to 40 atom %, and the base layer 14 has a region in which the compositional ratio decreases to 1 atom % or less from a certain position toward the surface side of the base layer 14 opposite to the substrate 12. The region where the compositional ratio of the carbon atoms decreases is the first region 16. In the first region 16, it can be said that the compositional ratio of carbon atoms is inclined in the thickness direction.

The decrease in the compositional ratio of carbon atoms in the base layer 14 which is the coating film formed by the sol-gel method means that the condensation rate of the sol-gel that functions as a binder of the coating film is increased. As a result, the first region 16 of the base layer 14 can be made harder, and the abrasion resistance of the surface of the base layer 14 can be improved. In addition, it is considered that, through a plasma treatment described below, in the first region 16 of the base layer 14, a functional group containing carbon atoms such as a Si—CH$_3$ group contained in the sol-gel is replaced by a Si—OH group by plasma containing oxygen, and that the Si—OH group and the Si—OH group are hardened by Si—O—Si (siloxane bond).

Figure 5:
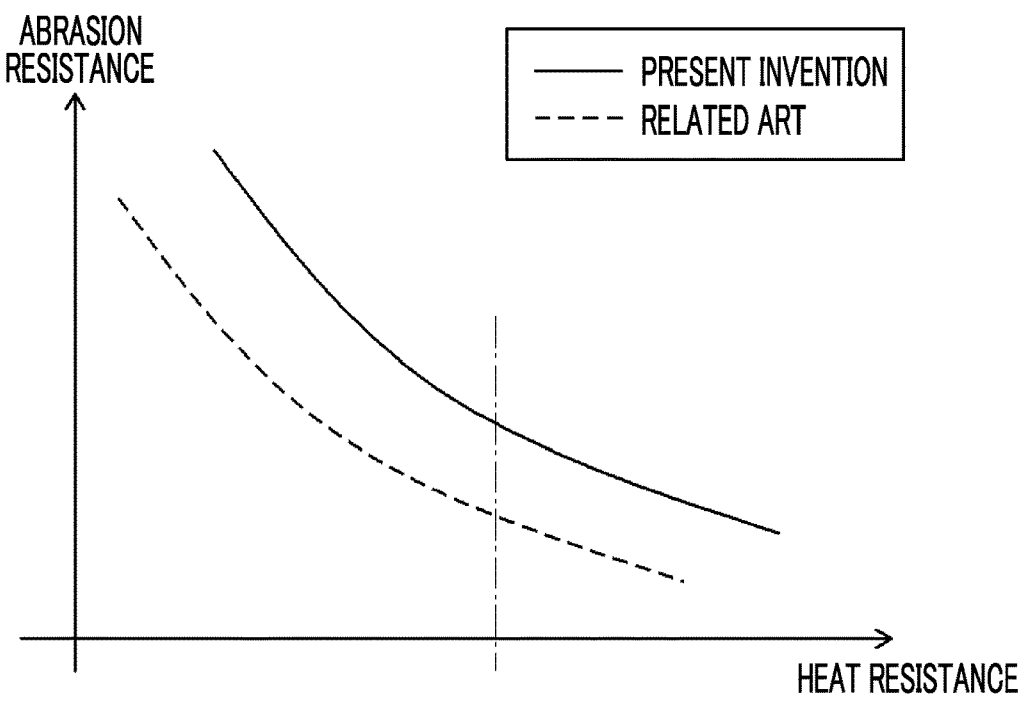
FIG. 5 is a graph schematically showing a relationship between heat resistance and abrasion resistance.

Here, as described above, in the hard coat layer formed of the sol-gel film containing inorganic nanoparticles, the condensation rate is increased to make the hard coat layer hard, whereby the abrasion resistance is improved. However, in a case where the condensation rate of the entire hard coat layer is increased, internal distortion increases, so that a problem arises that stress is concentrated and peeling is generated between the hard coat layer and the substrate in a case where a thermal cycle is repeated. On the other hand, in order to increase the heat resistance, it is necessary to lower the condensation rate, and the abrasion resistance cannot be improved. That is, as shown in FIG. 5, in the hard coat layer formed of the sol-gel film containing inorganic nanoparticles, there is a trade-off relationship between the abrasion resistance and the heat resistance.

With respect to this, in the hard coat laminate 10 according to the embodiment of the present invention, the first region 16 in which the compositional ratio of carbon atoms is inclined on the surface side of the substrate 12 of the base layer 14 is formed, whereby it is possible to suppress an increase in internal distortion due to a high condensation rate while improving the abrasion resistance by hardening the surface of the base layer 14. Therefore, even though the thermal cycle is repeated, stress concentration and peeling between the base layer 14 and the substrate 12 can be suppressed, and the heat resistance can be improved. That is, as shown in FIG. 5, it is possible to improve the abrasion resistance while maintaining the heat resistance as compared with the related art.

A favorable evaluation can be obtained not only in the heat resistance but also in a case where adhesion is evaluated using a cross-cut method.

The first region 16 of the base layer 14 has a hardness higher than that of the original base layer 14 (second region 18). Therefore, in a case where the overcoat layer is provided on the base layer 14, the hardness (abrasion resistance) can be ensured even though the thickness of the overcoat layer is thin. Therefore, it is possible to suppress change of color or lowering of transparency by the overcoat layer.

From the viewpoint of achieving both the heat resistance and the abrasion resistance, the thickness of the first region 16 is preferably 0.03 μm to 0.2 μm, more preferably 0.03 μm to 0.15 μm, and still more preferably 0.04 μm to 0.08 μm.

The compositional ratio of carbon atoms (C) in the base layer 14 (first region 16 and second region 18) and the thickness of the first region 16 need only be measured using X-ray photoelectron spectroscopy (XPS). XPS is also called electron spectroscopy for chemical analysis (ESCA).

In the measurement of the compositional ratio of carbon atoms and the thickness of the first region 16 using XPS, as an example, first, etching by argon ion plasma or the like and measurement by XPS are alternately performed to measure the amounts of silicon atoms (Si), carbon atoms (C), oxygen atoms (O), and the like at each position in the thickness direction. A measurement interval in the thickness direction by XPS need only be appropriately set according to an etching rate, a measuring device, and the like.

An example of the device and parameters is shown below.

Measuring device: ESCALab 200-R manufactured by VG Scientific

Anode: Mg (600 W)

Scanning range: 600-0 ev 3 times

PE: 150 ev

TOA: 90 degrees

Slit: A3

Iris: 13

(Etching Condition)

Ion species: Ar

Acceleration voltage: 3 kV

Current: 3 μA

Etching time: 50 seconds/level

Next, from the etching rate and the etching time, the position in the thickness direction measured by XPS is detected. Furthermore, the total of silicon atoms, carbon atoms, oxygen atoms, and the like is set to 1 (that is, 100%), and as the graph schematically shown in FIG. 3, the compositional ratio (compositional ratio profile) of carbon atoms in the thickness direction is detected.

The measurement by XPS is performed up to the second region 18 of the base layer 14, but in a case where the measurement value by XPS is constant in the second region 18 of the base layer 14, the measurement may not be performed any more.

The example shown in FIG. 3 represents a content of carbon atoms at each position in the thickness direction (film thickness) in an example of the hard coat laminate 10 having a layer structure in which the substrate 12 and the base layer 14 are laminated in this order as shown in FIG. 1. The horizontal axis in FIG. 3 is a position in the thickness direction and is substantially proportional to the etching time.

In the present invention, in a case where no other layer is disposed on the base layer 14, a point where Ar ion etching is started and digging is advanced by 5 nm is defined as the surface of the first region 16 of the base layer 14. Therefore, in FIG. 3, the compositional ratio of carbon atoms at the position of 5 nm in the thickness direction need only be 1 atom % or less. The reason for digging by 5 nm is to eliminate the influence of organic dirt and the like, because they are likely to adhere to the outermost surface of the base layer 14. In addition, as a method of obtaining the position in the thickness direction, the etching rate is obtained in advance using a dummy substrate of molten silica, the obtained etching rate is assumed to be the same as the etching rate of the first region in the present sample, and a point etched for a corresponding period of time is defined as the position in the thickness direction.

As will be described below, in a case where another layer is provided as in the configuration in which the overcoat layer 20 is provided on the base layer 14 of the hard coat laminate 10 (see FIG. 2), an interface between the base layer 14 and the overcoat layer 20 (another layer) is determined as follows.

In the same manner as described above, the compositional ratio of carbon atoms is obtained while performing Ar ion etching from the surface of the overcoat layer 20. An end of a portion where the inclination of the compositional ratio of carbon atoms is 0 is defined as an interface A between the base layer 14 and the overcoat layer 20. In a case where the composition of the base layer 14 and the overcoat layer 20 is significantly different, a boundary thereof is defined as the interface A.

Alternatively, the interface A between the base layer 14 and the overcoat layer 20 may be determined as follows.

A sample piece immersed in liquid nitrogen is split, and a cross section thereof is imaged using a scanning electron microscope (SEM). In a case where the base layer 14 and the first region 16 contain inorganic nanoparticles but the overcoat layer 20 does not contain inorganic nanoparticles, the overcoat layer 20 can be distinguished from the base layer 14 by SEM images. Therefore, the interface A between the overcoat layer 20 and the base layer 14 may be determined by this method.

Alternatively, the interface A between the base layer 14 and the overcoat layer 20 may be determined from a difference in contrast by imaging a cross-sectional SEM image in the same manner as described above.

In a case of the configuration in which the overcoat layer 20 is provided on the base layer 14 of the hard coat laminate 10, the compositional ratio of carbon atoms at the position of 5 nm from the interface A is defined as the compositional ratio of carbon atoms on the surface of the first region 16.

An interface B between the first region 16 and the second region 18 of the base layer 14 can be determined by drawing a straight line approximating the inclination of the compositional ratio of carbon atoms in the first region 16 and the inclination of the compositional ratio of carbon atoms in the second region 18 as shown in FIG. 3, and taking the intersection thereof. A straight line approximating the inclination of the compositional ratio of carbon atoms in the first region 16 and the second region 18 is determined as follows.

First, the compositional ratio of the second region is defined as a compositional ratio at a position 100 nm advanced from a position where a tangential line of the compositional ratio line of carbon atoms is 0. The inclination of the compositional ratio of carbon atoms in the second region 18 is set to 0 and a straight line is drawn. Next, a point of 1/10 and a point of 9/10 of the compositional ratio of carbon atoms in the second region 18 are obtained, and a straight line connecting these two points is defined as a straight line approximating the inclination of the compositional ratio of carbon atoms in the first region 16.

After determining the interface B between the first region 16 and the second region 18 in this way, the thickness of the first region 16 (from the surface to the interface) can be determined.

From the viewpoint of achieving both the heat resistance and the abrasion resistance, the compositional ratio of carbon atoms in the second region 18 is preferably 5 atom % to 40 atom %, more preferably 5 atom % to 20 atom %, and still more preferably 8 atom % to 15 atom %.

From the viewpoint of achieving both the heat resistance and the abrasion resistance, the compositional ratio of carbon atoms on the surface of the first region 16 is preferably 0 atom % to 1 atom %.

Here, in the hard coat laminate according to the embodiment of the present invention, a compositional ratio of hydrogen atoms to all elements (hereinafter, also simply referred to as a compositional ratio of hydrogen atoms) in the first region 16 decreases as the distance from the substrate 12 increases, and the compositional ratio of hydrogen atoms on the surface is preferably 18 atom % or less.

The decrease in the compositional ratio of hydrogen atoms also means that the condensation rate of the sol-gel that functions as a binder of the coating film is increased. As the condensation rate increases and the compositional ratio of hydrogen atoms decreases, a compositional ratio of silicon atoms increases relatively. That is, a density of the inorganic nanoparticles increases relatively. As a result, the first region 16 of the base layer 14 can be made harder, and the abrasion resistance of the surface of the base layer 14 can be improved. The low compositional ratio of hydrogen atoms means that the number of silanol (Si—OH) groups in the base layer 14 is reduced and replaced by siloxane bonds (Si—O—Si). In a case where the compositional ratio of carbon atoms is 0% on the surface of the first region 16, the hardness cannot be further distinguished from the compositional ratio of carbon atoms. Therefore, it is possible to obtain information on whether the film is harder or not by examining the compositional ratio of hydrogen atoms.

By setting the compositional ratio of hydrogen atoms in the first region 16 as described above, it is possible to suppress the increase in internal distortion due to the high condensation rate while improving the abrasion resistance by hardening the surface of the base layer 14. Therefore, even though the thermal cycle is repeated, stress concentration and peeling between the base layer 14 and the substrate 12 can be suppressed, and the heat resistance can be improved.

The compositional ratio of hydrogen atoms in the second region 18 is preferably 20 atom % to 40 atom %, more preferably 23 atom % to 38 atom %, and still more preferably 25 atom % to 35 atom %.

From the viewpoint of achieving both the heat resistance and the abrasion resistance, the compositional ratio of hydrogen atoms on the surface of the first region 16 is preferably 0 atom % to 18 atom %, more preferably 0 atom % to 15 atom %, and still more preferably 0 atom % to 12 atom %.

The compositional ratio of hydrogen atoms (H) to all elements in the base layer 14 (the first region 16 and the second region 18) need only be measured using hydrogen forward scattering spectrometry (HFS) and rutherford back-scattering spectrometry (RBS). Thus, it is possible to measure information on the composition in a depth direction in a non-destructive manner.

An example of the device and parameters is shown below.

Pelletron 3SDH manufactured by National Electrostatics Corporation

<In Case of Hydrogen Measurement (RBS/HFS Simultaneous Measurement)>

Incident ion $^4$He$^{++}$

Incidence energy 2300 kV

Incidence angle 75 deg

Scattering angle 160 deg

Integrated data for 9 points is used for the analysis.

By obtaining a signal amount of H/Si, a ratio of H to Si can be obtained. Note that, since desorption of H is generated by ion irradiation during measurement, H/Si at the start of ion irradiation is obtained by extrapolating the signal amount of H/Si obtained at 5 points of ion irradiation amount between 0.1 and 1 μC, and the obtained value of H/Si is defined as the true value of H/Si.

<In Case of Other Elements Measurement (RBS Measurement Alone)>

Incident ion $^4$He$^{++}$

Incidence energy 2300 kV

Incidence angle –30 deg

Scattering angle 160 deg

Irradiation dose Take 1 μC×42 points and calculate the average

C/Si obtained using this device is plotted as the vertical axis, and atoms/cm$^2$ (areal density of sample constituent atoms within a range through which ions have passed (atoms/cm$^2$)) is plotted as the horizontal axis. The horizontal axis represents the depth, but not the unit of nm. Therefore, atoms/cm$^2$ is replaced by nm by assuming that a portion of C/Si corresponding to the first region coincides with the inclination of the compositional ratio of carbon atoms obtained by the above-mentioned ESCA. Thus, depth information of H/Si is obtained.

As for the compositional ratio of all elements other than hydrogen atoms, the one obtained by the above-described ESCA has priority. That is, a compositional ratio of silicon atoms to oxygen atoms and a compositional ratio of silicon atoms to carbon atoms are treated as true, and, even though other elements are contained, a compositional ratio to silicon atoms obtained by ESCA is treated as true. Separately, the compositional ratio of hydrogen atoms to all elements can be obtained together with the information of H/Si obtained by HFS.

In a case of obtaining the compositional ratio of carbon atoms, measurement is performed using XPS because it is convenient to use XPS as a measuring method and XPS is more accurate than RBS/HFS (rutherford backscattering/hydrogen forward scattering spectrometry). On the other hand, in a case of obtaining the compositional ratio of hydrogen atoms, RBS/HFS is used because XPS cannot be used.

Next, each component constituting the hard coat laminate will be described in detail.

<Substrate>

As the substrate 12, a known sheet-shaped material (film or plate-shaped material) that is used as a substrate (support) for various hard coat laminates, various laminated functional films, and the like can be used.

The material of the substrate 12 is not limited, and various materials can be used as long as the base layer 14 and the overcoat layer 20 can be supported. As the material of the substrate 12, various resin materials are preferably exemplified.

Examples of the material of the substrate 12 include polyethylene (PE), polyethylene naphthalate (PEN), polyamides (PA), polyethylene terephthalate (PET), polyvinyl chloride (PVC), polyvinyl alcohol (PVA), polyacrylonitrile (PAN), polyimides (PI), transparent polyimides, polymethyl methacrylate resins (PMMA), polycarbonates (PC), polyacrylates, polymethacrylates, polypropylene (PP), polystyrene (PS), acrylonitrile-butadiene-styrene copolymers (ABS), cycloolefin copolymers (COC), cycloolefin polymers (COP), triacetyl cellulose (TAC), and ethylene-vinyl alcohol copolymers (EVOH).

The thickness of the substrate 12 can be appropriately set depending on the application, the material, and the like.

Although the thickness of the substrate 12 is not limited, it is preferably from 5 μm to 25 mm, and more preferably from 0.05 mm to 25 mm, from the viewpoint that the mechanical strength of the hard coat laminate 10 can be sufficiently secured, a hard coat laminate having favorable flexibility can be obtained, the weight and thickness of the hard coat laminate 10 can be reduced, and a hard coat laminate 10 having favorable flexibility can be obtained. For example, in a case where a resin base material used for the window of an automobile is used as a substrate, the thickness of 5 mm to 25 mm is preferable. On the other hand, in a case where the hard coat laminate is used as a single hard coat by being attached to another member, the thickness of 0.05 mm to 0.5 mm is preferable.

<Base Layer>

The base layer 14 is a thin film containing inorganic nanoparticles and is formed on the surface of the substrate 12. The base layer 14 contains inorganic nanoparticles by using, as a binder, a material obtained by hydrolyzing and condensing a coating material containing silicon atoms, oxygen atoms, and carbon atoms.

(Inorganic Nanoparticles)

Examples of the inorganic nanoparticles include silicon oxide particles (silica particles), titanium oxide particles, zirconium oxide particles, and aluminum oxide particles.

A particle size of the inorganic nanoparticles is preferably 5 nm to 200 nm, more preferably 5 nm to 40 nm, and still more preferably 10 nm to 20 nm.

A ratio of the inorganic nanoparticles in the base layer 14 is preferably 30% by mass to 70% by mass, more preferably 35% by mass to 65% by mass, and still more preferably 40% by mass to 60% by mass, from the viewpoint of the stability, heat resistance, and abrasion resistance of the coating composition.

(Binder)

As the binder, a condensate obtained by hydrolyzing and condensing organosiloxanes such as trialkoxysilane, dialkoxysilane, and tetraalkoxysilane is used.

The trialkoxysilane is represented by the following formula (1).

$$R^3Si(OR^4)_3 \tag{1}$$

(Note that, in the formula, $R^3$ is an alkyl group having 1 to 4 carbon atoms, a vinyl group, or an alkyl group having 1 to 3 carbon atoms substituted by one or more groups selected from the group consisting of a methacryloxy group, an amino group, a glycidoxy group, and a 3,4-epoxycyclohexyl group, and $R^4$ is an alkyl group having 1 to 4 carbon atoms.)

Examples of the trialkoxysilane include methyltrimethoxysilane, methyltriethoxysilane, ethyltrimethoxysilane, isobutyltrimethoxysilane, vinyltrimethoxysilane, vinyltriethoxysilane, γ-methacryloxypropyl trimethoxysilane, β-(3, 4-epoxycyclohexyl)ethyltrimethoxysilane, γ-glycidoxypropyltrimethoxysilane, γ-aminopropyltrimethoxysilane, γ-aminopropyltriethoxysilane, N-β(aminoethyl) γ-aminopropyltrimethoxysilane, and N-β(aminoethyl) γ-aminopropyltriethoxysilane. These can be used alone or in combination of two or more.

In order to obtain a coating composition for forming a hard coat layer having particularly excellent abrasion resistance, it is preferable that 70% by weight or more of the coating composition is methyltrialkoxysilane, and it is more preferable that substantially the entire amount is methyltrialkoxysilane. Note that the above-described trialkoxysilanes other than methyltrialkoxysilane may be added in a small amount for the purpose of improving adhesiveness, hydrophilicity, water repellency, or the like.

A hydrolysis condensate of trialkoxysilane is a mixture of a hydrolysis product of a part or the entirety of the trialkoxysilane and a condensate obtained through a condensation reaction of a part or the entirety of the hydrolysate, and these can be obtained by a sol-gel reaction.

The thickness of the base layer 14 is preferably 3 μm to 10 μm, more preferably 4 μm to 8 μm, and still more preferably 5 μm to 7 μm, from the viewpoint of the heat resistance and abrasion resistance.

<Overcoat Layer>

The overcoat layer 20 is a layer for enhancing the hardness of the base layer 14 or for imparting antifouling property.

The overcoat layer may be an inorganic protective layer containing at least one oxide (inorganic oxide) of Ti, Zr, or Al as a main component. Alternatively, the overcoat layer 20 may be an organic protective layer formed of an organic material.

The thickness of the overcoat layer is preferably 10 nm to 250 nm, more preferably 30 nm to 250 nm, and still more preferably 100 nm to 200 nm, from the viewpoint of protecting the base layer 14 and the viewpoint of preventing breakage and preventing a decrease in transmittance.

The inorganic protective layer is a layer formed of an inorganic material. As the inorganic protective layer, various films formed of a material having high transparency and favorable adhesiveness to the base layer can be used. For example, a silicon oxide film, an aluminum oxide film, a titanium oxide film, and a zirconium oxide film can be used.

In particular, from the viewpoint that the inorganic protective layer has high transparency and has flexibility, and various materials and film forming methods can be used, a silicon oxide film is suitably exemplified.

The inorganic protective layer can be formed by a known method depending on the material. Suitable examples of the method include various gas phase film deposition methods, for example, plasma CVDs (chemical vapor deposition) such as atmospheric pressure plasma CVD, capacitively coupled plasma (CCP)-CVD, and inductively coupled plasma (ICP)-CVD, sputtering such as atomic layer deposition (ALD), magnetron sputtering, and reactive sputtering, and vacuum vapor deposition. Alternatively, the inorganic base layer may be formed by coating. In the formation by coating, for example, a silicon oxide layer can be formed by applying perhydropolysilazane (PHPS) and reacting perhydropolysilazane with oxygen. Among these, plasma CVD such as atmospheric pressure plasma CVD, CCP-CVD, and ICP-CVD is suitably used from the viewpoint that adhesion between the base layer and the inorganic protective layer can be improved. Atmospheric pressure plasma CVD is suitably used from the viewpoint of productivity.

As the organic protective layer, for example, an antifouling layer that prevents dirt from adhering to the surface is formed.

As the antifouling layer, a known antifouling layer of the related art containing an organic fluorine compound can be appropriately used. The antifouling layer need only be formed by applying a coating composition containing an organic fluorine compound to the surface of the base layer and curing it.

The composition for forming an organic protective layer preferably includes an organic solvent, a surfactant, a silane coupling agent, and the like, in addition to the organic compound.

The thickness of the organic protective layer is not limited, and can be appropriately set depending on the components included in the coating composition for forming an overcoat layer, the base layer, and the like.

The organic protective layer can be formed by a known method depending on the material.

For example, the organic protective layer can be formed by a coating method in which the above-described composition for forming an organic protective layer is applied and dried. In the formation of the organic protective layer by the coating method, the dried composition for forming an organic protective layer is further irradiated with ultraviolet rays to polymerize (crosslink) the organic compound in the composition, as necessary.

[Method for Manufacturing Hard Coat Laminate]

Hereinafter, an example of a method for manufacturing the hard coat laminate 10 according to the embodiment of the present invention will be described.

(Preparation of Coating Composition)

First, a coating composition to be the base layer 14 is prepared. The coating composition is preferably prepared as follows from the viewpoint of obtaining a base layer having no precipitation and having more excellent abrasion resistance.

Trialkoxysilane is subjected to hydrolysis condensation reaction under acidic conditions in a colloidal solution containing inorganic nanoparticles. In the following description, as an example, a case where trialkoxysilane is subjected to hydrolysis condensation reaction under acidic conditions in a colloidal silica dispersion containing silica particles as inorganic nanoparticles will be described.

Here, water required for the hydrolysis reaction of the trialkoxysilane is supplied from the water-dispersed colloidal silica dispersion, and water may be further added as necessary. The amount of water is usually 1 to 10 equivalents, preferably 1.5 to 7 equivalents, and more preferably 3 to 5 equivalents based on 1 equivalent of the total of the trialkoxysilane.

The hydrolysis condensation reaction of this trialkoxysilane is preferably performed under acidic conditions, and an acid is generally used as a hydrolyzing agent for hydrolysis under these conditions. This acid may be added to the trialkoxysilane or colloidal silica dispersion in advance, or may be added after mixing both. This addition may be performed once or twice or more. Examples of the acid include inorganic acids such as hydrochloric acid, sulfuric acid, nitrate, phosphoric acid, nitrite, perchloric acid, and sulfamic acid, and organic acids such as formic acid, acetic acid, propionic acid, butyric acid, oxalic acid, succinic acid, maleic acid, lactic acid, and paratoluenesulfonic acid, and, from the viewpoint of ease of pH control, organic carboxylic acids such as formic acid, acetic acid, propionic acid, butyric acid, oxalic acid, succinic acid, and maleic acid are preferable, and acetic acid is more preferable.

In a case where an inorganic acid is used as the acid, it is preferably used at a concentration of 0.0001 to 2 and more preferably used at a concentration of 0.001 to 0.1. In addition, in a case where an organic acid is used, it is preferably used in a range of 0.1 to 50 parts by weight, and more preferably used in a range of 1 to 30 parts by weight, based on 100 parts by weight of trialkoxysilane.

The conditions for hydrolysis and condensation reaction of trialkoxysilane vary depending on the type of trialkoxysilane used, the type and amount of colloidal silica coexisting in the system, and the like. Preferred conditions are 5 g/Kg to 22 g/Kg humidity, more preferably 8 g/Kg to 16 g/Kg humidity, and still more preferably 14 g/Kg to 16 g/Kg humidity. A temperature of the system is 20° C. to 40° C., and a reaction time is 1 hour to several days. Although the hydrolysis reaction of trialkoxysilane is an exothermic reaction, it is desirable that the temperature of the system does not exceed 60° C. at the highest. After the hydrolysis reaction sufficiently proceeds under such conditions, the condensation reaction preferably proceeds at 40° C. to 80° C. for 1 hour to several days in order to stabilize the coating composition.

The hydrolyzed trialkoxysilane becomes a hydrolysate having Si—OH. Condensation reaction between Si—OH on the surface of colloidal silica and Si—OH in the molecule of the hydrolysate of other trialkoxysilane different from that molecule occurs, thereby forming a Si—O—Si bond. In addition, condensation reaction between the generated condensate and another Si—OH occurs, thereby forming a Si—O—Si bond. This hydrolysis reaction and condensation reaction proceed partially but not completely.

The coating composition usually further contains a curing catalyst. Examples of the catalyst include lithium salts of aliphatic carboxylic acids such as formic acid, propionic acid, butyric acid, lactic acid, tartaric acid, and succinic acid, alkali metal salts such as sodium salt and potassium salts, and quaternary ammonium salts such as benzyltrimethylammonium salts, choline salts, tetramethylammonium salts, and tetraethylammonium salts. The curing catalyst is preferably 0.01 to 10 parts by weight, and more preferably 0.1 to 5 parts by weight, based on 100 parts by weight of an organosiloxane resin solid content.

As a solvent used in the coating composition, it is necessary that the organosiloxane resin solid content is stably dissolved, and for that purpose, an alcohol is desirably contained in the solvent in an amount of at least 20% by weight or more, and preferably 50% by weight or more. Examples of the alcohol include methanol, ethanol, 1-propanol, 2-propanol, 1-butanol, 2-butanol, 2-methyl-1-propanol, 2-ethoxyethanol, 4-methyl-2-pentanol, and 2-butoxyethanol, and a low-boiling point alcohol having 1 to 4 carbon atoms is preferable, and, from the viewpoint of solubility, stability, and coating properties, 2-propanol is more preferable. The solvent includes a lower alcohol generated by hydrolysis of alkoxysilane, an organic solvent of a dispersion medium of organic solvent dispersion type colloidal silica, and an acid added for pH adjustment of a coating liquid. Examples of the acid used for pH adjustment include inorganic acids such as hydrochloric acid, sulfuric acid, nitrate, phosphoric acid, nitrite, perchloric acid, and sulfamic acid, and organic acids such as formic acid, acetic acid, propionic acid, butyric acid, oxalic acid, succinic acid, maleic acid, lactic acid, and paratoluenesulfonic acid, and, from the viewpoint of ease of pH control, organic carboxylic acids such as formic acid, acetic acid, propionic acid, butyric acid, oxalic acid, succinic acid, and maleic acid are preferable. It is necessary that other solvents are miscible with water/alcohols, including ketones such as acetone, methyl ethyl ketone, and methyl isobutyl ketone, ethers such as tetrahydrofuran, 1,4-dioxane, and 1,2-dimethoxyethane, and esters such as ethyl acetate, n-butyl acetate, isobutyl acetate, and ethoxyethyl acetate. The solvent is preferably 50 to 900 parts by weight, and more preferably 150 to 700 parts by weight, based on 100 parts by weight of the organosiloxane resin solid content.

It is desirable to adjust the pH of the coating composition to 3.0 to 6.0, and preferably 4.0 to 5.5 by adjusting the content of the acid and the curing catalyst. Thus, it is possible to prevent gelation of the coating liquid at normal temperature and to increase storage stability. This coating liquid is usually further aged for several hours to several days to obtain a stable composition.

The coating composition may contain an ultraviolet absorber. Thus, it is possible to improve the weather fastness of the base layer. This ultraviolet absorber is used in an amount of 0.1 to 6.0 parts by weight, and preferably 0.2 to 5.0 parts by weight, based on 100 parts by weight of the organosiloxane resin solid content.

(Formation of Cured Layer)

The coating composition prepared as described above is applied onto the substrate and cured by heating to form a cured layer.

As a coating method, known methods such as a bar coating method, a dip coating method, a flow coating method, a spray coating method, a spin coating method, and a roller coating method can be used.

The substrate onto which the coating composition is applied is cured by heating after the solvent is dried and removed therefrom. In the process of thermosetting, the remaining Si—OH undergoes condensation reaction to form a Si—O—Si bond, thereby forming a cured layer. The thermosetting is performed under conditions of 5 g/Kg to 22 g/Kg humidity, more preferably 8 g/Kg to 18 g/Kg humidity, and still more preferably 14 g/Kg to 16 g/Kg humidity. A temperature thereof is preferably in a range of 50° C. to 200° C., more preferably 80° C. to 160° C., and still more preferably 100° C. to 140° C. A heating time is preferably 10 minutes to 4 hours, more preferably 20 minutes to 3 hours, and still more preferably 30 minutes to 2 hours.

A known leveling agent can be formulated to the coating composition for the purpose of improving the coating properties and the smoothness of the obtained coating film. In addition, dyes, pigments, fillers, and the like may be added as long as the object of the present invention is not impaired.

(Plasma Treatment)

After a cured film by sol-gel is formed on the substrate in this way, plasma treatment is performed on the surface of the cured film. By performing the plasma treatment, it is possible to form a first region in which the compositional ratio of carbon atoms decreases as the distance from the substrate increases.

Figure 6:
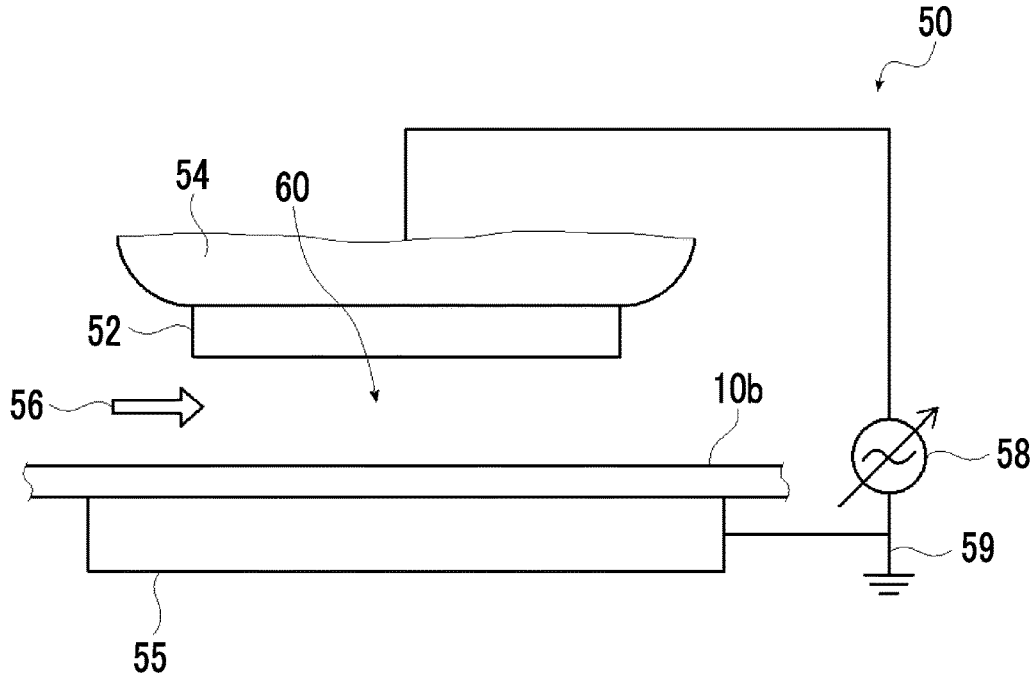
FIG. 6 is a diagram conceptually showing an example of a plasma apparatus that manufactures the hard coat laminate according to the embodiment of the present invention.

FIG. 6 shows a conceptual diagram of an example of a treatment apparatus that performs plasma treatment on a cured layer.

A plasma treatment apparatus 50 shown in FIG. 6 includes a pair of electrodes consisting of a first electrode 54 and a second electrode 55, a dielectric 52 bonded to the first electrode 54, an alternating current (AC) power supply 58 connected to the first electrode 54 and the second electrode 55. The second electrode 55 is connected to a ground 59.

A space between the first electrode 54 and the second electrode 55 is a discharge space 60 in which plasma is generated. The substrate 12 on which the cured layer is formed is transported to the discharge space 60, a gas flow 56 is supplied into the discharge space 60, and a voltage is applied to the electrode pair by the AC power supply 58, to generate plasma and perform the plasma treatment on the surface of the cured layer.

The gas flow 56 is set with at least one of the groups of argon, air, and nitrogen. For example, pure argon may be used as a carrier gas, or alternatively, a mixture of argon and air or nitrogen and argon may be used in any concentration.

After setting the gas flow, energy is supplied to the first electrode 54 and the second electrode 55 by the AC power supply 58 which is adjustable. The AC power supply 58 is adjusted to supply an AC voltage having an amplitude in a range of 3 kV to 6 kV which is up to 40% higher than a breakdown voltage (preferably the amplitude is 10% to 20% higher than the breakdown voltage) at a frequency in a range of 50 kHz to 1 MHz (preferably 100 to 700 kHz). Once the amplitude reaches the breakdown voltage, plasma is generated between the dielectric 52 and the substrate 12 (cured layer). Simultaneously with the plasma generation, the substrate 12 is transported in a predetermined direction in order to treat the substrate 12 along its entire surface.

In addition, the carrier gas may include oxygen, carbon dioxide, $NH_3$, common precursor gasses such as $SiH_4$, hydrocarbons, organosilicons such as tetraethoxysilane (TEOS) and hexamethyldisiloxane (HMDSO), or organometallics, or combinations or mixtures of these gases. These gases may be present in the carrier gas from the beginning of the treatment. Favorable results are achieved by adding more gas after a step of stabilizing the plasma. This addition is most satisfactorily performed by stabilizing the plasma after each step until a desired concentration (for example, 20%) is established, with fractional stepwise increments.

The stepwise fractional increments described above include gas concentration increments of the concentration of additional gases, the increments being relatively small compared to the concentration finally desired. As an example, increment of the concentration to its maximum desired value in, for example, 4 steps (25% of the total) or 10 steps (10% or the total) or 20 steps (5% of the maximum desired concentration) is considered as relatively small steps compared to the concentration finally desired.

Alternatively, chemical addition of a reaction gas to the carrier gas is performed after uniform glow plasma is ignited in the carrier gas and operated for approximately 10 seconds to 20 seconds. A concentration of the reaction gas added to the carrier gas is gradually increased at a small percentage concentration step, after which a voltage applied to the plasma is gradually increased at about 5% to 10% per step to maintain the plasma stably.

The dielectric 52 includes materials such as polyethylene terephthalate (PET), polyethylene naphthalate (PEN), polytetrafluoroethylene (PTFE), or ceramics such as silica or alumina. Any combination or mixture may be used as well.

The stabilization of the plasma is achieved by adjusting the voltage characteristics such that a voltage rise time is in a range of 0.1 to 10 kV/μs. Preferably, it is achieved using a value in a range of 0.1 to 5 kV/μs. The voltage rise time depends on the amplitude and frequency of the AC voltage and is influenced by the dielectric permeability of the dielectric 52 and the thickness of the dielectric material.

Stable plasmas can be easily achieved, particularly at a plasma current density equal to or less than 5 mA/cm², by maintaining a plasma current density less than 10 mA/cm².

A distance, which forms the discharge space 60, between the dielectric 52 and the substrate 12 is in a range of 0.1 μm to 5 mm, and is preferably 250 μm to 1500 μm. A volumetric gas flux of the gas flow 56 is in a range of 1 L/min to 50 L/min, and is preferably about 40 L/min. The thickness of the dielectric 52 is 1 μm to 1000 μm, and preferably between 250 μm and 500 μm.

In this way, the surface of the cured layer is subjected to the plasma treatment, whereby a methyl component of Si—CH₃ present in a region on the surface side of the cured layer is cut by plasma and replaced by siloxane-bonded Si—O—Si. Thus, it is possible to increase a degree of condensation of the sol-gel functioning as a binder only on the surface. That is, it is possible to form, in the region on the surface side of the cured layer, a first region in which the compositional ratio of carbon atoms decreases as the distance increases from the substrate.

Since the first region formed by the plasma treatment is a thin condensed layer, the hardness of the surface can be increased without affecting the heat resistance. Therefore, it is possible to increase the abrasion resistance while maintaining the heat resistance. In addition, since the inorganic nanoparticles contained in the base layer are made of a material having a high degree of condensation, a volume reduction rate on the surface of the first region is limited compared to the surface of the cured layer made only of a sol-gel, which has been subjected to the plasma treatment, and an increase in stress is suppressed, so that the abrasion resistance can be increased without impairing the heat resistance.

Further, in a case where the overcoat layer is formed on the base layer, the overcoat layer need only be formed on the base layer by the above-described method. In a case where the overcoat layer is an inorganic protective layer, the overcoat layer can be formed by an apparatus used for plasma treatment of the base layer. Therefore, it is possible to increase the productivity because the production can be performed consistently.

Hereinbefore, the hard coat laminate according to the embodiment of the present invention has been described in detail, but the present invention is not limited to the above-described aspects, and various improvements and changes can be made without departing from the spirit of the present invention.

For example, the hard coat laminate may have layers other than the substrate, base layer, and overcoat layer described above. For example, the hard coat laminate may have a functional layer used in various optical films such as an ultraviolet absorbing layer and an antifouling layer. These functional layers may be provided on the surface of the substrate opposite to the base layer, may be provided between the substrate and the base layer, may be provided between the base layer and the overcoat layer, or may be provided on the surface of the base layer (surface of the overcoat layer in a case where the overcoat layer is provided).

Figure 7:
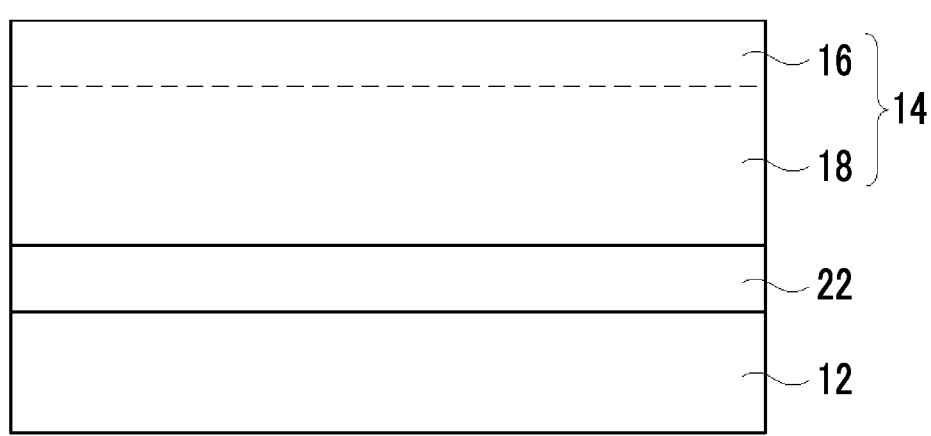
FIG. 7 is a diagram conceptually showing still another example of the hard coat laminate according to the embodiment of the present invention.

For example, the example shown in FIG. 7 is an example of the hard coat laminate according to the embodiment of the present invention having an ultraviolet absorbing layer 22 between the substrate 12 and the base layer 14.

EXAMPLES

Hereinafter, the present invention will be described specifically with reference to Examples. The present invention is not limited to specific examples shown below.

Example 1

As a substrate, a polycarbonate film having a thickness of 0.5 mm (Panlite manufactured by Teijin Chemicals Ltd.) was prepared.

(Preparation of Coating Composition for Forming Base Layer)

A water-dispersed colloidal silica dispersion (SNOWTEX 30 manufactured by Nissan Chemical Corporation, concentration of solid contents: 30% by weight) containing silica particles having a particle size of 12 nm, which are inorganic nanoparticles, was prepared.

To 100 parts by mass of the water-dispersed colloidal silica dispersion, 2 parts by mass of distilled water and 20 parts by mass of acetic acid were added and stirred, and to this dispersion, 130 parts by mass of methyltrimethoxysilane was added under cooling in an ice water bath. A coating composition was obtained by mixing 2 parts by mass of sodium acetate as a curing catalyst in a reaction liquid obtained by stirring the mixed solution at 25° C. for 1 hour under cooling in ice water and diluting the obtained mixture with 200 parts by mass of isopropanol.

(Formation of Cured Layer)

The coating composition prepared above was applied to one surface of the polycarbonate film serving as a substrate with a wire bar, left standing at 25° C. for 20 minutes, and then cured through heating and drying in an atmosphere with a humidity of 16 g/Kg and a temperature of 120° C. for 1 hour using a hot air circulation oven, thereby forming a cured layer. The thickness thereof was 5 μm.

(Plasma Treatment)

Using a plasma treatment apparatus as shown in FIG. 6, the surface of the cured layer formed above was subjected to the plasma treatment.

Specifically, two metal plates facing each other (first electrode and second electrode, an area of the facing portion of 2 cm×18 cm) were prepared, a dielectric (alumina, thickness of 0.5 mm) plate was superposed on the first electrode, and a polycarbonate substrate on which the cured layer was formed was disposed on the second electrode. 20 L/min of nitrogen and 0.2 L/min of oxygen were allowed to flow into the discharge space at atmospheric pressure. The substrate was transported in such a way as to slide on the second electrode at a speed of 1 m/min. A power with a frequency of 200 kHz, 440 W, and an amplitude of 3 kV was applied between the electrodes to generate plasma (plasma generation area of about 2 cm×18 cm). This plasma treatment was repeated 30 times. The treatment time for one time was 1.2 seconds, and the cumulative treatment time was 36 seconds.

As a result, a base layer having a first region in which the compositional ratio of carbon atoms decreases as the distance from the substrate increases was formed.

The compositional ratio of carbon atoms in the thickness direction of the produced base layer and the thickness of the first region were measured by the above-mentioned ESCA. As a result, it was confirmed that the compositional ratio of carbon atoms decreased as the distance from the substrate increased in the region on the surface side of the base layer, that is, the first region was formed. The compositional ratio of carbon atoms on the surface of the first region was 0 atom %. The compositional ratio of carbon atoms in the second region was 11 atom %. The thickness of the first region was 60 nm.

The compositional ratio of hydrogen atoms in the thickness direction of the produced base layer was measured by the above-mentioned rutherford backscattering/hydrogen forward scattering spectrometry (RBS/HFS). As a result, it was confirmed that the compositional ratio of hydrogen atoms decreased as the distance from the substrate increased in the first region. The compositional ratio of hydrogen atoms on the surface of the first region was 8 atom %. The compositional ratio of hydrogen atoms in the second region was 32 atom %.

Example 2

A hard coat laminate was produced in the same manner as in Example 1 except that an overcoat layer was formed on the base layer as described below.
(Formation of Overcoat Layer)
An overcoat layer was formed on the base layer using the plasma treatment apparatus used in Example 1. Tetraethoxysilane (TEOS) was introduced into a vaporizer at a rate of 0.15 g/hr, mixed with 2 L/min of nitrogen gas, and vaporized by setting the vaporizer to a temperature of 60° C. The gas was mixed with a gas supplied at a rate of $N_2$: 38 L/min and $O_2$: 0.06 L/min and introduced into the discharge space. A silica film (overcoat layer) was formed by transporting the substrate at the same transportation speed and tension as in the plasma treatment of Example 1 and applying the same power, frequency, and voltage to generate plasma. By repeating this process 30 times, a silica film having a thickness of 150 nm was formed.

Example 3

A hard coat laminate was produced in the same manner as in Example 1 except that the transportation speed of the substrate during the plasma treatment was 3 m/min and the number of times of treatment was 5. The compositional ratio of carbon atoms and the compositional ratio of hydrogen atoms were measured in the same manner as in Example 1. It was confirmed that the first region was formed from the compositional ratio of carbon atoms. The compositional ratio of carbon atoms on the surface of the first region was 0 atom %. The compositional ratio of carbon atoms in the second region was 11 atom %. The thickness of the first region was 60 nm. The compositional ratio of hydrogen atoms on the surface of the first region was 18 atom %. The compositional ratio of hydrogen atoms in the second region was 32 atom %.

Example 4

In the preparation of the coating composition, a hard coat laminate was produced in the same manner as in Example 1 except that a mixed solution of 50 parts by mass of methyltriethoxysilane and 80 parts by mass of dimethyldimethoxysilane was used instead of 130 parts by mass of methyltriethoxysilane. The compositional ratio of carbon atoms and the compositional ratio of hydrogen atoms were measured in the same manner as in Example 1. It was confirmed that the first region was formed from the compositional ratio of carbon atoms. The compositional ratio of carbon atoms on the surface of the first region was 0 atom %. The compositional ratio of carbon atoms in the second region was 40 atom %. The thickness of the first region was 60 nm. The compositional ratio of hydrogen atoms on the surface of the first region was 8 atom %. The compositional ratio of hydrogen atoms in the second region was 40 atom %.

Example 5

In the preparation of the coating composition, a hard coat laminate was produced in the same manner as in Example 1 except that a mixed solution of 80 parts by mass of methyltriethoxysilane and 50 parts by mass of TEOS was used instead of 130 parts by mass of methyltriethoxysilane. The compositional ratio of carbon atoms and the compositional ratio of hydrogen atoms were measured in the same manner as in Example 1. It was confirmed that the first region was formed from the compositional ratio of carbon atoms. The compositional ratio of carbon atoms on the surface of the first region was 0 atom %. In a case where the compositional ratio of hydrogen atoms was measured in the same manner as in Example 1, the compositional ratio of carbon atoms of the second region was 5 atom %. The thickness of the first region was 60 nm. The compositional ratio of hydrogen atoms on the surface of the first region was 5 atom %. The compositional ratio of hydrogen atoms in the second region was 20 atom %.

Example 6

A hard coat laminate was produced in the same manner as in Example 2 except that the number of times of treatment for forming the overcoat layer was changed from 30 to 2.

Example 7

A hard coat laminate was produced in the same manner as in Example 2 except that the number of times of treatment for forming the overcoat layer was changed from 30 to 50.

Example 8

A hard coat laminate was produced in the same manner as in Example 1 except that the transportation speed of the substrate during the plasma treatment was 3 m/min and the number of times of treatment was 3. The compositional ratio of carbon atoms and the compositional ratio of hydrogen atoms were measured in the same manner as in Example 1. It was confirmed that the first region was formed from the compositional ratio of carbon atoms. The compositional ratio of carbon atoms on the surface of the first region was 0 atom %. The compositional ratio of carbon atoms in the second region was 11 atom %. The thickness of the first region was 60 nm. The compositional ratio of hydrogen atoms on the surface of the first region was 20 atom %. The compositional ratio of hydrogen atoms in the second region was 32 atom %.

Comparative Example 1

A hard coat laminate was produced in the same manner as in Example 1 except that the plasma treatment was not performed. The compositional ratio of carbon atoms and the compositional ratio of hydrogen atoms were measured in the same manner as in Example 1. It was confirmed that the first region was not formed from the compositional ratio of carbon atoms. The compositional ratio of carbon atoms in the base layer was constant at 11 atom %. The compositional ratio of hydrogen atoms in the base layer was constant at 32 atom %.

Comparative Example 2

In the preparation of the coating composition, a hard coat laminate was produced in the same manner as in Comparative Example 1 except that a mixed solution of 30 parts by mass of methyltriethoxysilane and 100 parts by mass of TEOS was used instead of 130 parts by mass of methyltriethoxysilane. The compositional ratio of carbon atoms and the compositional ratio of hydrogen atoms were measured in the same manner as in Example 1. It was confirmed that the first region was not formed from the compositional ratio of carbon atoms. The compositional ratio of carbon atoms in the base layer was constant at 3 atom %. The compositional ratio of hydrogen atoms in the base layer was constant at 15 atom %.

Comparative Example 3

A hard coat laminate was produced in the same manner as in Example 1 except that the transportation speed of the substrate during the plasma treatment was 5 m/min and the number of times of treatment was 1. The compositional ratio of carbon atoms and the compositional ratio of hydrogen atoms were measured in the same manner as in Example 1. It was confirmed that the first region was formed from the compositional ratio of carbon atoms. The compositional ratio of carbon atoms on the surface of the first region was 2 atom %. The compositional ratio of carbon atoms in the second region was 11 atom %. The thickness of the first region was 60 nm. The compositional ratio of hydrogen atoms on the surface of the first region was 28 atom %. The compositional ratio of hydrogen atoms in the second region was 32 atom %.

Comparative Example 4

In the preparation of the coating composition, a hard coat laminate was produced in the same manner as in Example 1 except that a mixed solution of 40 parts by mass of methyltriethoxysilane and 90 parts by mass of dimethyldimethoxysilane was used instead of 130 parts by mass of methyltriethoxysilane. The compositional ratio of carbon atoms and the compositional ratio of hydrogen atoms were measured in the same manner as in Example 1. It was confirmed that the first region was formed from the compositional ratio of carbon atoms. The compositional ratio of carbon atoms on the surface of the first region was 0 atom %. The compositional ratio of carbon atoms in the second region was 45 atom %. The thickness of the first region was 60 nm. The compositional ratio of hydrogen atoms on the surface of the first region was 8 atom %. The compositional ratio of hydrogen atoms in the second region was 45 atom %.

<Evaluation>

The abrasion resistance and heat resistance of the produced hard coat laminates of Examples and Comparative Examples were evaluated.

(Abrasion Resistance)

The surface of the base layer was evaluated by using an abrasion wheel CS-10F manufactured by Calibrase Co. Ltd. by abrading the surface of the abrasion wheel for 25 times of rotation with S-11 polishing paper manufactured by Calibrase Co. Ltd. prior to test, followed by performing a Taber abrasion test for 1000 times of rotation at a load of 500 g and measuring a difference $\Delta H$ between the haze before the Taber abrasion test and the haze after the Taber abrasion test was measured and evaluated (in compliance with ASTM D1044). (Haze=Td/Tt×100, Td: scattered light transmittance, Tt: total light transmittance)

(Heat Resistance)

A cycle of room temperature (20° C.) for 2 hours and 110° C. for 2 hours was repeated 10 times, and visual observation and SEM image observation were performed to check for breakage and peeling. A case where there is no peeling was evaluated as A, and a case where there is peeling was evaluated as B.

The results are shown in Table 1.

TABLE 1

| | Base layer | | | | | | Overcoat layer | | Evaluation | |
| | First region | | | | Second region | | | | | |
| | Presence or absence | Thickness nm | Compositional ratio of C atom % | Compositional ratio of H atom % | Compositional ratio of C atom % | Compositional ratio of H atom % | Presence or absence | Thickness nm | Abrasion resistance ΔH % | Heat resistance |
|---|---|---|---|---|---|---|---|---|---|---|
| Example 1 | Present | 60 | 0 | 8 | 11 | 32 | Absent | — | 1.5 | A |
| Example 2 | Present | 60 | 0 | 8 | 11 | 32 | Present | 150 | 1.1 | A |
| Example 3 | Present | 60 | 0 | 18 | 11 | 32 | Absent | — | 2.0 | A |
| Example 4 | Present | 60 | 0 | 8 | 40 | 40 | Absent | — | 1.9 | A |
| Example 5 | Present | 60 | 0 | 5 | 5 | 20 | Absent | — | 1.0 | A |
| Example 6 | Present | 60 | 0 | 8 | 11 | 32 | Present | 10 | 1.3 | A |
| Example 7 | Present | 60 | 0 | 8 | 11 | 32 | Present | 250 | 1.2 | A |
| Example 8 | Present | 60 | 0 | 20 | 11 | 32 | Absent | — | 2.5 | A |
| Comparative Example 1 | Absent | — | — | — | 11 | 32 | Absent | — | 9.0 | A |
| Comparative Example 2 | Absent | — | — | — | 3 | 15 | Absent | — | 1.9 | B |
| Comparative Example 3 | Present | 60 | 2 | 28 | 11 | 32 | Absent | — | 7.0 | A |
| Comparative Example 4 | Present | 60 | 0 | 8 | 45 | 45 | Absent | — | 4.0 | A |

From Comparative Example 1 and Comparative Example 2, it can be seen that, in a case where the first region is not provided, the overall condensation rate is low, that is, in a case where the compositional ratio of carbon atoms is large, the heat resistance is favorable, but the abrasion resistance is low, and, on the other hand, in a case where the overall condensation rate is high, that is, in a case where the compositional ratio of carbon atoms is small, the abrasion resistance is high, but the heat resistance is lowered. In addition, from Comparative Example 3, it can be seen that the abrasion resistance is not sufficient in a case where the compositional ratio of carbon atoms on the surface of the first region (the surface of the base layer) is high. In addition, it can be seen from Comparative Example 4 that the abrasion resistance is lowered even in a case where the compositional ratio of carbon atoms in the second region is high.

With respect to this, it can be seen that the hard coat laminate according to the embodiment of the present invention, in which the base layer has the first region in which the compositional ratio of carbon atoms decreases as the distance from the substrate increases, the compositional ratio of carbon atoms on the surface of the first region is 1 atom % or less, and the compositional ratio of carbon atoms in the second region is 5 atom % to 40 atom % can achieve both the abrasion resistance and the heat resistance compared to the Comparative Examples.

From Examples 2, 6, and 7, it can be seen that the overcoat layer is provided, whereby the abrasion resistance can be further improved. In addition, it can be seen that the thickness of the overcoat layer is preferably 10 nm to 250 nm.

From the comparison of Examples 1, 3, and 8, it can be seen that the compositional ratio of hydrogen atoms is preferably 18 atom % or less.

From the results of Examples 1, 4, and 5 and Comparative Examples 2 and 4, it can be seen that the compositional ratio of carbon atoms in the second region is 5 atom % to 40 atom %.

From the results, the effect of the present invention is apparent.

EXPLANATION OF REFERENCES

10: hard coat laminate
12: substrate
14: base layer
16: first region
18: second region
20: overcoat layer
22: ultraviolet absorbing layer
50: plasma treatment apparatus
52: dielectric
54: first electrode
55: second electrode
56: gas flow
58: AC power supply
59: ground
60: discharge space

What is claimed is:

1. A hard coat laminate comprising:
a substrate; and
a base layer disposed on one main surface side of the substrate,
wherein the base layer contains inorganic nanoparticles, and alkoxysilane as a binder,
the base layer contains oxygen atoms, carbon atoms, and silicon atoms, the base layer has, on a surface side opposite to the substrate, a first region in which a compositional ratio of carbon atoms to all elements excluding hydrogen decreases as a distance from the substrate increases,
in a region other than the first region of the base layer, a compositional ratio of carbon atoms to all elements excluding hydrogen is 5 atom % to 40 atom %, and
a compositional ratio of carbon atoms on a surface of the first region is 1 atom % or less.

2. The hard coat laminate according to claim 1,
wherein, in the first region, a compositional ratio of hydrogen atoms to all elements decreases as the distance from the substrate increases, and a compositional ratio of hydrogen atoms on the surface is 18 atom % or less.

3. The hard coat laminate according to claim 1,
wherein the inorganic nanoparticle is at least one of oxide particles of any of Si, Ti, Zr, or Al.

4. The hard coat laminate according to claim 1, further comprising:
an overcoat layer which contains an inorganic oxide as a main component and is disposed on a surface of the base layer on a first region side.

5. The hard coat laminate according to claim 4,
wherein a thickness of the overcoat layer is 10 nm to 250 nm.

6. The hard coat laminate according to claim 4,
wherein the inorganic oxide contained in the overcoat layer is at least one oxide of Si, Ti, Zr, or Al.

7. The hard coat laminate according to claim 1,
wherein the base layer is formed of a coating composition obtained by adding inorganic nanoparticles to a coating liquid containing silicon atoms, oxygen atoms, and carbon atoms.

8. The hard coat laminate according to claim 2,
wherein the inorganic nanoparticle is at least one of oxide particles of any of Si, Ti, Zr, or Al.

9. The hard coat laminate according to claim 2, further comprising:
an overcoat layer which contains an inorganic oxide as a main component and is disposed on a surface of the base layer on a first region side.

10. The hard coat laminate according to claim 9,
wherein a thickness of the overcoat layer is 10 nm to 250 nm.

11. The hard coat laminate according to claim 5,
wherein the inorganic oxide contained in the overcoat layer is at least one oxide of Si, Ti, Zr, or Al.

12. The hard coat laminate according to claim 9,
wherein the inorganic oxide contained in the overcoat layer is at least one oxide of Si, Ti, Zr, or Al.

13. The hard coat laminate according to claim 2,
wherein the base layer is formed of a coating composition obtained by adding inorganic nanoparticles to a coating liquid containing silicon atoms, oxygen atoms, and carbon atoms.

14. The hard coat laminate according to claim 3, further comprising:
an overcoat layer which contains an inorganic oxide as a main component and is disposed on a surface of the base layer on a first region side.

15. The hard coat laminate according to claim 14,
wherein a thickness of the overcoat layer is 10 nm to 250 nm.

16. The hard coat laminate according to claim 14,
wherein the inorganic oxide contained in the overcoat layer is at least one oxide of Si, Ti, Zr, or Al.

17. The hard coat laminate according to claim 15, wherein the inorganic oxide contained in the overcoat layer is at least one oxide of Si, Ti, Zr, or Al.

18. The hard coat laminate according to claim 3, wherein the base layer is formed of a coating composition obtained by adding inorganic nanoparticles to a coating liquid containing silicon atoms, oxygen atoms, and carbon atoms.

19. The hard coat laminate according to claim 4, wherein the base layer is formed of a coating composition obtained by adding inorganic nanoparticles to a coating liquid containing silicon atoms, oxygen atoms, and carbon atoms.

20. The hard coat laminate according to claim 5, wherein the base layer is formed of a coating composition obtained by adding inorganic nanoparticles to a coating liquid containing silicon atoms, oxygen atoms, and carbon atoms.

21. The hard coat laminate according to claim 1, wherein a thickness of the base layer is 3 μm to 10 μm, and a thickness of the first region is 0.03 μm to 0.2 μm.

* * * * *